(12) United States Patent
Tseng

(10) Patent No.: US 6,271,147 B1
(45) Date of Patent: Aug. 7, 2001

(54) METHODS OF FORMING TRENCH ISOLATION REGIONS USING SPIN-ON MATERIAL

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/642,499

(22) Filed: Aug. 18, 2000

(51) Int. Cl.[7] ................................................. H01L 21/302
(52) U.S. Cl. ..................... 438/725; 438/424; 438/427; 438/428; 438/692; 438/734; 438/704; 438/753; 438/719; 438/749
(58) Field of Search ................................. 438/424, 427, 438/428, 692, 693, 725, 719, 734, 749, 753, 756, 704

(56) References Cited

U.S. PATENT DOCUMENTS

| | | | |
|---|---|---|---|
| 5,899,716 | * 5/1999 | Tseng | 438/254 |
| 5,963,819 | * 10/1999 | Lan | 438/424 |
| 5,966,614 | * 10/1999 | Park et al. | 438/401 |
| 6,074,931 | * 6/2000 | Chang et al. | 438/424 |
| 6,080,637 | * 6/2000 | Huang et al. | 438/424 |
| 6,093,621 | * 7/2000 | Tseng | 438/424 |

FOREIGN PATENT DOCUMENTS 08-288256 * 11/1996 (JP) .

* cited by examiner

*Primary Examiner*—Gregory Mills
*Assistant Examiner*—George Goudreau
(74) *Attorney, Agent, or Firm*—Darby & Darby

(57) ABSTRACT

Disclosed are improved and simplified methods of forming trench isolation regions. A photoresist pattern having an opening therein is directly formed on a bare semiconductor substrate. The bare semiconductor substrate is etched through the opening in the photoresist pattern to form a trench in the substrate. The photoresist pattern is then isotropically etched to enlarge the size of the opening. A spin-on material layer is coated overlying the substrate surface to fill the trench and the enlarged opening, and then etched back until the photoresist pattern is exposed. After removing the photoresist pattern, the spin-on material layer is cured to form a trench isolation region which are less susceptible to edge defects.

14 Claims, 6 Drawing Sheets

METHODS OF FORMING TRENCH ISOLATION REGIONS USING SPIN-ON MATERIAL

BACKGROUND OF THE INVENTION

1. Field of the Invention

The present invention relates to trench isolation methods for integrated devices. More particularly, it relates to methods of forming trench isolation regions using spin-on material.

2. Description of the Related Arts

Device isolation techniques play an important role in the design and performance of highly integrated semiconductor circuits by electrically isolating regions and devices therein from adjacent devices and regions. Moreover, as the degree of integration in semiconductor circuits increases, there is a concomitant need to develop techniques for forming isolation regions which are free of defects and can be scaled to provide isolation regions having smaller dimensions, but without sacrificing the isolation capability of the regions.

One widely used and relatively simple technique for providing device isolation is typically referred to as local oxidation of silicon (LOCOS). Unfortunately, this technique has a number of disadvantages because it typically includes the formation of bird's beak oxide extensions, induces lattice stress which can lead to the formation of crystal defects in semiconductor substrates, and causes redistribution of channel-stop dopants. As will be understood by those skilled in the art, these disadvantages typically cause a reduction in the lateral area available for active devices, and degrade the reliability and performance of devices formed in adjacent active regions.

Another method which may be considered an improvement over the LOCOS method is typically referred to as the shallow trench isolation (STI) method. In the STI method, a device isolation region is established by selectively etching a semiconductor substrate to form trenches therein and then filling the trenches with an electrically insulating region (e.g., oxide). A chemical etching and/or chemical-mechanical polishing (CMP) step can then be performed to planarize the electrically insulating region to be level with the surface of the substrate. Because the STI method typically does not include a lengthy thermal oxidation step as typically required by the LOCOS method, many of the disadvantages of the LOCOS method can be eliminated to some degree. However, as will be understood by those skilled in the art, the STI method may be prone to a "dishing" phenomenon which can degrade the isolation characteristics of trench isolation regions.

Hereinafter, a conventional trench isolation method for a semiconductor device will be described with reference to FIGS. 1 through 6. First, referring to FIG. 1, a pad oxide layer 12 and a nitride layer 14 are deposited on a semiconductor substrate 10 in sequence. The pad oxide layer 12 functions as a protection layer for an active region during the formation of a trench. Then, a photoresist pattern 16, for defining a region in which the trench is to be formed, is formed on the nitride layer 14. Then, as shown in FIG. 2, the nitride layer 14 and the pad oxide layer 12 are etched in sequence using the photoresist pattern 16 as an etching mask to form a nitride layer pattern 14A and a pad oxide layer pattern 12A. Then, the semiconductor substrate 10 is dry-etched to form a trench 17 with a predetermined depth. Next, as shown in FIG. 3, after removing the photoresist pattern 16, an oxide layer 18 is formed on the nitride layer pattern 14A with a predetermined thickness while completely filling the trench 17, using a chemical vapor deposition (CVD) method.

Then, as shown in FIG. 4, the oxide layer 18 is planarized by a chemical mechanical polishing (CMP) process, using the surface of the nitride layer pattern 14A as a planarization stop, to form a field oxide layer pattern 18A. Thereafter, as shown in FIG. 5, the nitride layer pattern 14A and the pad oxide layer pattern 12A are removed to define the trench isolation region 18A. Then, a sacrificial oxidation process and a cleaning process are performed to complete a trench isolation region 18B as shown in FIG. 6.

However, according to the conventional trench isolation method, the edge portion of the oxide layer filling the trench is also etched by the sacrificial oxidation process or the cleaning process, showing a profile such as portion "A" shown in FIG. 6. That is, the device isolation region is slanted at the upper boundary between the active region and the device isolation region, so that a gate oxide layer becomes thinner at the boundary and an electric field is concentrated thereon. Also, stress may be applied to an upper insulation region to be formed in a following step. This stress can promote the generation of leakage currents and otherwise deteriorate the characteristics of the devices formed in adjacent active regions.

Thus, it would be highly desirable to be able to provide trench isolation regions which are less susceptible to edge defects.

U.S. Pat. No. 5,966,614 discloses simplified trench isolation methods for integrated circuit devices. However, the methods disclosed in U.S. Pat. No. 5,966,614 will degrade performance of MOS transistors due to sharp edge on trench corner after dipping of sacrificial oxide (see first and second embodiment of U.S. Pat. No. 5,966,614).

SUMMARY OF THE INVENTION

It is therefore an object of the invention to provide improved methods of forming trench isolation regions in semiconductor substrates which are less susceptible to edge defects.

It is another object of the invention to provide simplified methods of forming trench isolation regions by eliminating the formation, etching and removal of silicon nitride.

It is yet another object of the invention to provide simplified trench isolation methods, by which improved performance of integrated circuits can be obtained.

To attain the above and other objects, the present invention provides methods of forming trench isolation regions by using spin-on material as a trench insulating layer. In one embodiment, a photoresist pattern having an opening therein is directly formed on a bare semiconductor substrate. The bare semiconductor substrate is etched through the opening in the photoresist pattern to form a trench in the substrate. The photoresist pattern is isotropically etched to enlarge the size of the opening. A spin-on material layer is coated overlying the substrate surface to completely fill the trench and the enlarged opening, and then etched back until the photoresist pattern is exposed. After removing the photoresist pattern from the bare semiconductor substrate, the spin-on material layer is cured by a thermal treatment to form a trench isolation region.

After formation of the trench isolation region, a sacrificial oxide layer may be formed on substrate surface and ions may be implanted through the oxide layer. The ions may be used to form wells and channel stops and to control the threshold voltage of devices that are subsequently formed.

According to a feature of the present invention, trench isolation regions can be formed having reduced susceptibility to edge defects because the periphery of the trench at the face of the substrate is covered by the insulating material.

According to another feature of the present invention, conventional trench isolation methods are simplified by eliminating silicon nitride layer.

According to yet another feature of the present invention, the trench insulating layer is deposited in the presence of the photoresist pattern, and thereafter cured in the absence of the photoresist pattern.

According to a further feature of the present invention, the manufacturing cost can be reduced because the insulating materials formed by a spin-coating process cost much less than those by chemical vapor deposition (CVD) techniques.

DESCRIPTION OF THE PREFERRED EMBODIMENTS

The present invention now will be described more fully hereinafter with reference to the accompanying drawings. It should be understood that when a layer or region is referred to as being "on" another layer, region, or substrate, it can be directly on the other layer, region, or substrate, or intervening layers or regions may also be present. Conversely, when a layer or region is indicated as being "directly on" another layer, region, or substrate, intervening layers or regions are not present.

Figure 1:
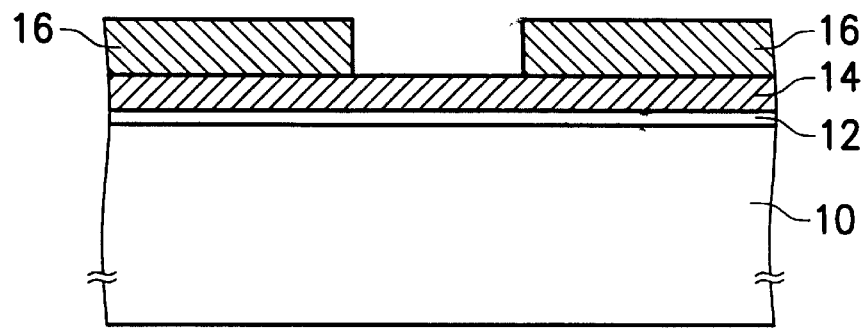
FIGS. 1–6 are schematic cross-sectional views illustrating conventional trench isolation methods.
Figure 2:
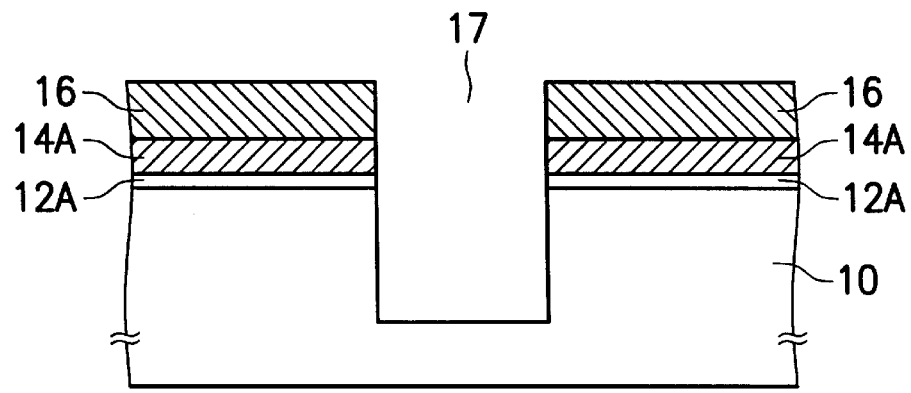
Figure 7:
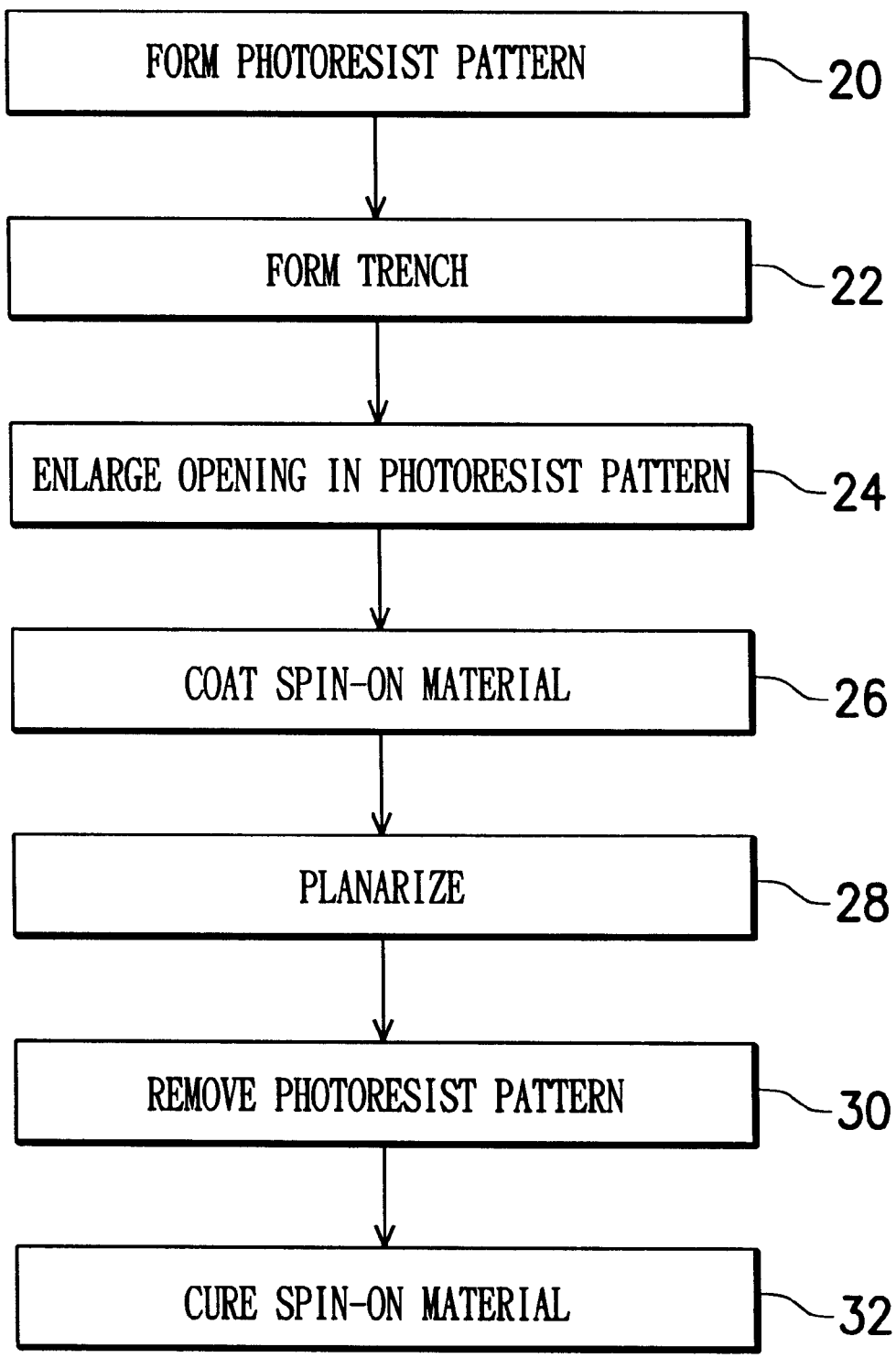
FIG. 7 is a block diagram sequentially showing trench isolation methods according to the present invention.
Figure 8:
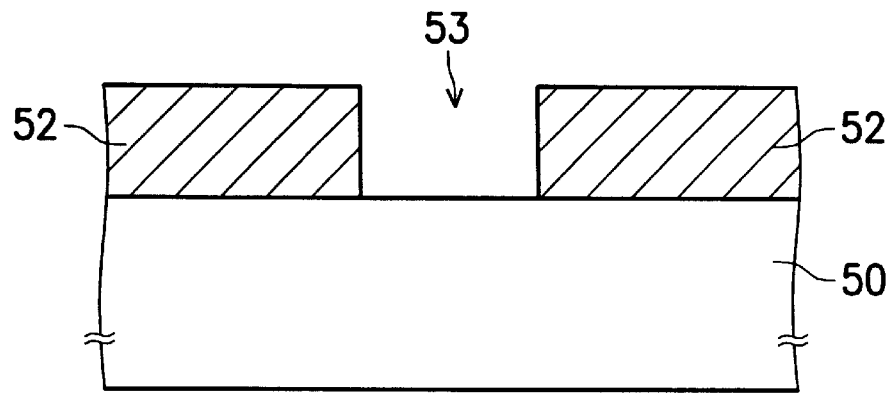
FIGS. 8–14 are schematic cross-sectional views illustrating trench isolation methods according to a preferred embodiment of the invention.

FIG. 2 is a block diagram of trench isolation methods according to the present invention. In contrast with the conventional methods illustrated by FIGS. 1–6, the methods of FIG. 7 include a first step of forming a photoresist pattern (Block 20), a second step of forming a trench (Block 22), a third step of enlarging an opening in the photoresist pattern (Block 24), a fourth step of coating spin-on material to fill the trench and the enlarged opening (Block 26), a fifth step of planarization (Block 28), a sixth step of removing the photoresist pattern (Block 30), and a seventh step of curing the spin-on material (Block 32). That is, the steps of forming a pad oxide layer, forming a silicon nitride layer, patterning a silicon nitride layer, and removing the silicon nitride layer, may be eliminated. Also note that the trench insulating layer (i.e., the spin-on material) is deposited in the presence of the photoresist pattern. In comparison, conventional trench isolation methods typically remove the photoresist pattern before depositing a trench insulating layer.

Figure 3:
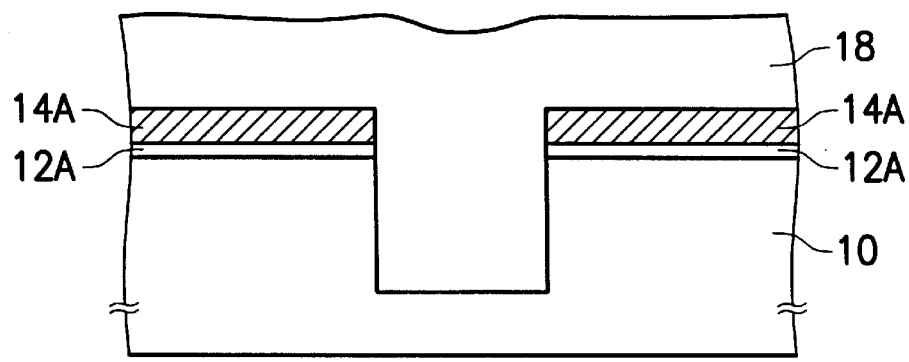
Figure 4:
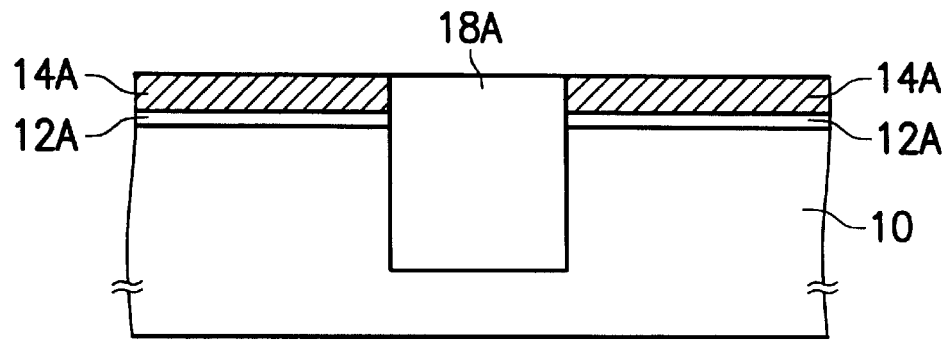
Figure 5:
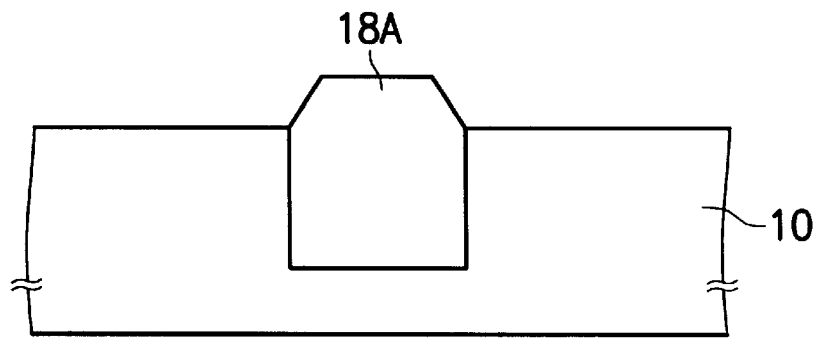
Figure 6:
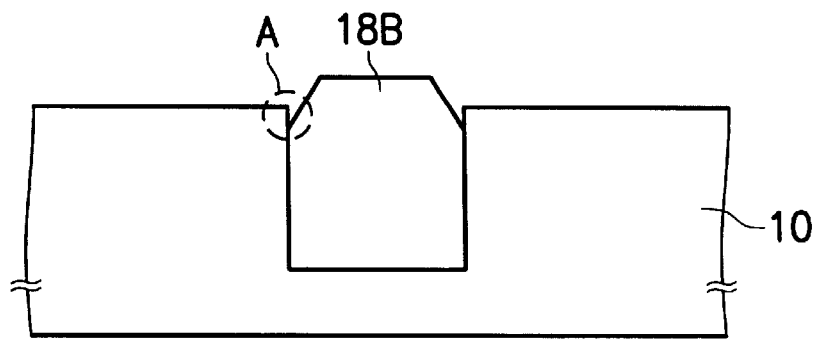

Referring now to FIGS. 8–14, a preferred method of forming a trench isolation region according to an embodiment of the present invention will be described. FIG. 3 shows a step of forming a mask pattern 52 on a semiconductor substrate 50. The semiconductor substrate 50 is covered with a material used for an etching mask, for example, photoresist, to form a photoresist layer. The photoresist layer is then patterned until part of the substrate is exposed to form a mask pattern 52. The mask pattern includes an opening 53 which exposes the isolation area to formed in the substrate.

According to a preferred embodiment, before forming the photoresist pattern 52, an adhesive layer, for example, a thin thermal oxide layer or a silicon dioxide layer formed by chemical vapor deposition is formed, to enhance adhesion of the photoresist pattern 52 to the substrate 50.

Figure 9:
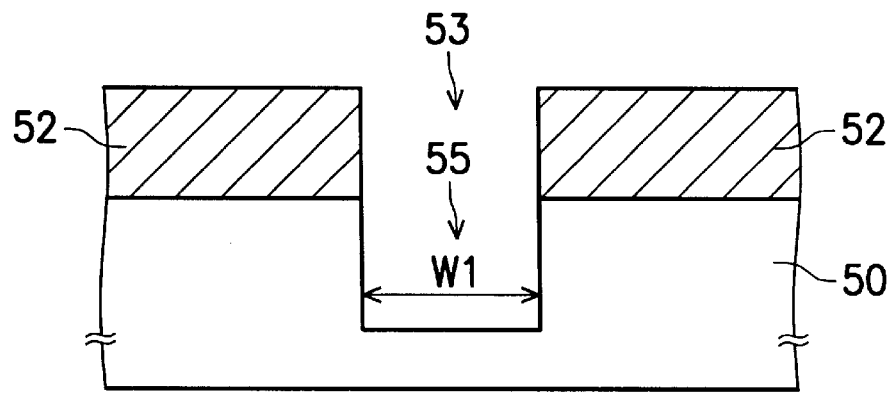

FIG. 9 shows the step of forming a trench 55. The trench 55 is formed by etching the substrate 50 to a predetermined depth using the photoresist pattern 52 as an etch mask. Here, the trench is etched to a depth in the range of 3,500 Å to 5,000 Å. The trench 55 has a width W1 when viewed in transverse cross-section.

Figure 10:
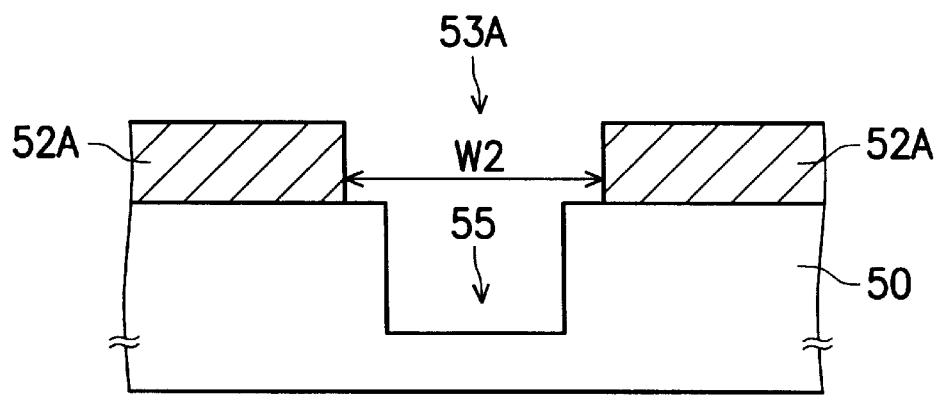

FIG. 10 shows the step of enlarging the opening 53 in the photoresist pattern 52. The size of the opening 53 may be enlarged by exposing the photoresist pattern 52 to an etchant comprising oxygen plasma. During this step, the photoresist pattern is etched in all directions (i.e., is isotropically etched), including the portions defining the periphery of the opening 53. Thus, the resulting photoresist pattern 52A forms an enlarged opening 53A which has a width W2 greater than the trench width W1.

Figure 11:
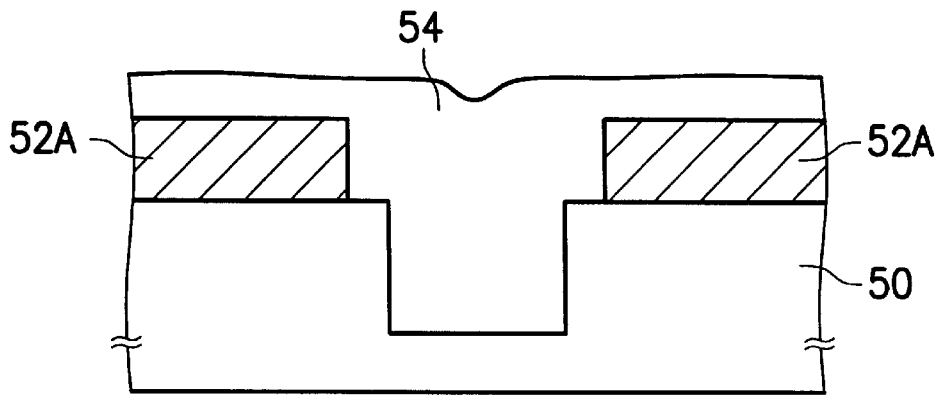

FIG. 11 shows the step of coating spin-on material 54 overlying substrate surface. A layer of siloxane or silicate spin-on-glass 54 is coated to fill the trench 55 and the enlarged opening 53A in the photoresist pattern 52A. Alternatively, the layer 54 may be a coating of a spin-on-polymer, such as methyl silsesquioxane or methyl siloxane. As illustrated, the spin-on-glass or spin-on-polymer layer 54 also extends onto an upper surface of the photoresist pattern 52A. The spin-on material 54 is subjected to soft-bake after coating, but is not cured until the photoresist pattern 52A is removed. This precludes the photoresist pattern 52A from destruction at a high temperature curing process. A preferred spin-on material for the trench insulating layer 54 is undoped spin-on-glass.

According to another aspect of the invention, a thermal oxide layer (not shown) having a thickness of about 50–250 Å can be formed on the entire surface of the substrate 50, including the sidewalls and bottom of the trench 55, before coating the insulating layer 54. The thermal oxide layer can remove defects and stress in the substrate 50, that may be generated during plasma etching for forming the trench.

Figure 12:
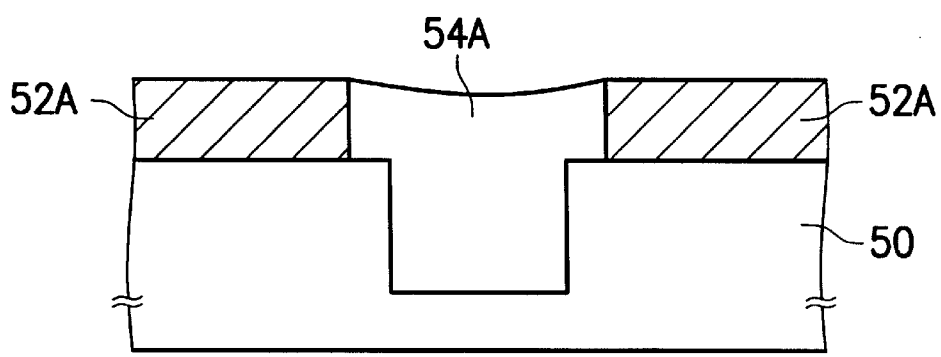

FIG. 12 shows a step of planarization of the insulating layer 54. The spin-on-glass or spin-on-polymer layer 54 is etched back by a plasma etch until the photoresist pattern 52A is exposed. Accordingly, an insulating layer 54A that buries the enlarged opening and the trench is formed. As illustrated, the insulating layer 54A covers a periphery of the trench at the face of the substrate.

Figure 13:
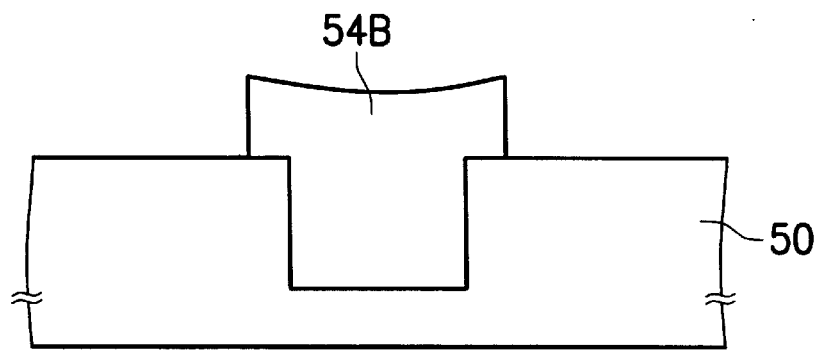

FIG. 13 show a step of forming an isolation region 54B from the insulating layer 54A. The photoresist pattern 52A is removed by a conventional step such as photoresist ashing. Subsequently, the spin-on-glass or spin-on-polymer of insulating layer 54A is cured by a thermal treatment to form an isolation region 54B having a T-shape when viewed in transverse cross-section.

Figure 14:
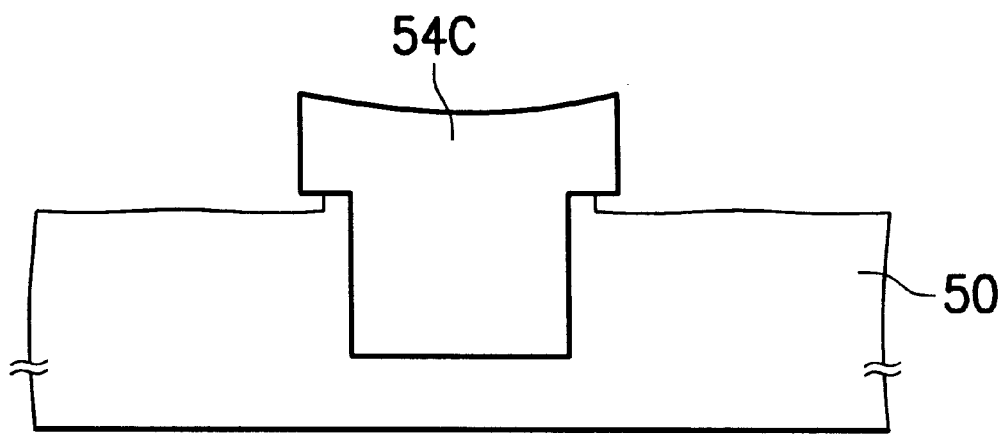

Then, a sacrificial oxide layer may be grown to a thickness of 50–200 Å through a conventional sacrificial oxidation process. Ion implantation of impurities, for example, ion implantation for wells, channel stops, or threshold voltage control, may be performed. Then, the sacrificial oxide layer may be removed using buffered oxide etchant (EOE) or hydrofluoric acid (HF). This defines a final trench isolation region 54C as shown in FIG. 14.

As illustrated, because the isolation region 54B has extensions which cover the entrance or periphery of the trench so that these portions of the active regions which extend adjacent the sidewalls of the trench are not exposed even as the sacrificial oxide layer is removed by wet or dry etching techniques. This improves the profile of the edge portions of the device isolation region which means that the concentration of the electric fields at the edge portions can be reduced and the stress applied to the trench isolation region can also be reduced so that a semiconductor device having improved characteristics can be fabricated in the active semiconductor regions on opposite sides of the trench isolation region.

While the invention has been particularly shown and described with reference to the preferred embodiment thereof, it will be understood by those skilled in the art that various changes in form and details may be made without departing from the spirit and scope of the invention.

What is claimed is:

1. A method for forming a trench isolation region using spin-on material, comprising the steps of:
    forming a photoresist pattern directly on a bare semiconductor substrate, said photoresist pattern having an opening therein;
    etching the bare semiconductor substrate through the opening in said photoresist pattern, to form a trench in the substrate;
    enlarging the size of the opening in said photoresist pattern;
    coating a spin-on material layer in the trench and in the enlarged opening in the photoresist pattern;
    planarizing the spin-on material layer;
    removing the photoresist pattern from the bare semiconductor substrate; and
    curing the spin-on material layer to form a trench isolation region.

2. The method as claimed in claim 1, wherein the step of enlarging the size of the opening comprises exposing the photoresist pattern to an etchant comprising oxygen plasma.

3. The method as claimed in claim 1, wherein said spin-on material layer comprising spin-on-glass.

4. The method as claimed in claim 1, wherein said spin-on material layer comprising spin-on-polymer.

5. The method as claimed in claim 1, wherein the step of planarizing the spin-on material layer comprises etching back said spin-on material layer using a plasma etch.

6. The method as claimed in claim 1, wherein said photoresist pattern is removed by using oxygen plasma.

7. The method as claimed in claim 1, wherein the following steps are performed after the steps of curing the spin-on material layer:
    forming a sacrificial oxide layer on the surface of the semiconductor substrate;
    implanting ions through the sacrificial oxide layer; and
    removing the sacrificial oxide layer.

8. The method as claimed in claim 1, wherein the following step is performed prior to the step of coating a spin-on material layer:
    forming a thermal oxide lining in the trench.

9. A method for forming a trench isolation region using spin-on material, comprising the steps of:
    forming an adhesive layer on a semiconductor substrate;
    forming a photoresist pattern having an opening therein on the adhesive layer, wherein the adhesive layer enhances adhesion between the substrate and the photoresist pattern;
    etching the adhesive layer and the semiconductor substrate through the opening in said photoresist pattern, to form a trench in the substrate;
    enlarging the size of the opening in said photoresist pattern;
    coating a spin-on material layer in the trench and in the enlarged opening in the photoresist pattern;
    planarizing the spin-on material layer;
    removing the photoresist pattern; and
    curing the spin-on material layer to form a trench isolation region.

10. The method as claimed in claim 9, wherein the step of enlarging the size of the opening comprises exposing the photoresist pattern to an etchant comprising oxygen plasma.

11. The method as claimed in claim 9, wherein said spin-on material layer comprising spin-on-glass.

12. The method as claimed in claim 9, wherein said spin-on material layer comprising spin-on-polymer.

13. The method as claimed in claim 9, wherein the step of planarizing the spin-on material layer comprises etching back said spin-on material layer using a plasma etch.

14. The method as claimed in claim 9, wherein said adhesive layer is an oxide layer.

* * * * *